INVENTORS
THOMAS P. ROSE &
CALVIN T. HOLLOWOOD

BY
FRANK W. BARNES
AGENT

CONDUCTIVE ADHESIVE ARTICLES AND MANUFACTURE

INVENTORS
THOMAS P. ROSE &
CALVIN T. HOLLOWOOD
BY
FRANK W. BARNES
AGENT

United States Patent Office 3,435,127
Patented Mar. 25, 1969

3,435,127
CONDUCTIVE ADHESIVE ARTICLES AND MANUFACTURE

Thomas P. Rose and Calvin T. Hollowood, Inkster, Mich., assignors to Burroughs Corporation, Detroit, Mich., a corporation of Michigan Filed May 3, 1965, Ser. No. 452,484
Int. Cl. H01b 3/14
U.S. Cl. 174—94 12 Claims

ABSTRACT OF THE DISCLOSURE

An electrically conductive metal screen having the interstices partially filled with a low viscosity non-tacky but reactivatable adhesive and the outer surfaces of the screen clear of the adhesive. A method of producing the coated screen by submerging it in a bath of adhesive and hanging the coated screen in a vertical position to dry. A method of bonding the coated screen to another conductive article in metal-to-metal contact by reactivating the adhesive through heat or solvent, applying pressure to bond the article until cooled or until the solvent is evaporated respectively, and then removing the pressure. A method of repairing ruptures in the printed circuits plated on a plastic backing by reactivating the adhesive of the conductive article over the break and allowing the adhesive to harden under pressure.

This invention relates to conductive adhesive articles and, more specifically, to reactivatable conductive adhesive articles and their manufacture.

In the manufacture of various types of electrical and electronic components, it is often necessary to bond permanently and conductively two or more conductive surfaces. Moreover, in the manufacture and/or repair of printed circuit boards, it is necessary to join a plurality of terminals or, in the case of rupture, it is desirable to be able to repair the damaged circuit by conductively coating over the defect.

It will be appreciated that when conductively joining two conductive surfaces it is desirable to have as low an ohmic resistance bond between the two conductors as is possible. Heretofore joining the two surfaces has been accomplished by soldering, tack-welding, or utilization of expensive conductive adhesives.

Although soldering of terminals and leads is a relatively simple and economic operation when performed by a skilled craftsman, an attempt to join two adjacent plates or conductors in a conductive bond often results in an unsatisfactory joint.

It is current practice today to repair ruptures in printed circuit boards by soldering. It will be appreciated that when working with miniaturized circuits, this operation is not only difficult and time-consuming, but also requires a skilled craftsman in order to prevent the formation of cold solder joints which result in defective circuits.

It is known in the art that a conductive adhesive which is capable of bonding two adjacent conductive surfaces, can be formed by loading epoxy adhesives with silver or gold powder to form a plastic conductive solder. The metal particles of these plastic solders are held in an electrical particle-to-particle contact by an elastic binder or mastic. Current can thus flow through the plastic solder via the individual metal particles.

Use of these metal-filled conductive adhesives has produced bonds of high or relatively high ohmic resistance and at the same time has been fairly expensive since the metals used in these conductive adhesives are of the classification known as "noble metals."

Attempts to reduce the cost of metal filled adhesives have produced metal coated particles, that is, a particle having an outer surface of a noble metal such as gold or silver powder with an inner surface of a less expensive material. This process is still too expensive for many applications.

It is also well known to form a conductive gasket using aluminum alloy cloth which has been impregnated with silicone rubber or the like; however, to utilize this material as a conductive bonding agent, some form of adhesive such as epoxy must be coated on both sides of the gasket in order to join the two conductors. The epoxy adhesive which is nonconductive renders the gasket nonconductive and thereby makes the combination unsuitable for use as a conductive adhesive article.

It is, therefore, an object of this invention to provide an inexpensive reactivatable conductive adhesive article capable of bonding two conductors.

It is a further object of this invention to produce a reactivatable conductive adhesive article which may be utilized simply and effectively in the repair of printed circuit boards.

It is a still further object of this invention to provide a reactivatable conductive adhesive article having low ohmic resistance.

In carrying out the above objectives, applicants' invention comprises a process wherein a nonoxidizing metal screen of fine mesh is coated with a suitable adhesive and dried in a vertical position. The adhesive which partially fills only the interstices of the screen may be reactivated in accordance with the invention by either of two methods. The first includes the steps of placing the conductive adhesive article between two conductors to be bonded, applying predetermined amounts of heat and pressure for a predetermined period to bring the screen in direct physical contact with the conductors, removing the heat and allowing the bonded material to cool, and finally, the removal of the bonded material from pressure. The second method includes saturating the conductive adhesive article with a suitable solvent, placing said article between two conductors to be bonded, applying a predetermined pressure until the solvent evaporates, and removing the bonded article from pressure.

Additionally, applicants' invention comprises a process wherein the conductive adhesive article is bonded on only one surface to a thin metal foil. The exposed surface of this article may be reactivated by either of the two processes hereinabove described for use in many situations such as printed circuit board repairs.

Further objects and advantages will become apparent and be specifically pointed out in the following specification when taken with accompanying drawings in which.

Figure 2:
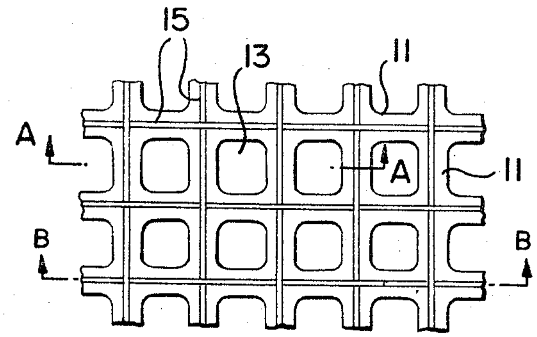
FIG. 2 is a top elevation view of the conductive adhesive article showing the interstices partially filled by the conductive adhesive.

6, the coated screen portion of the article is portrayed as viewed from line B—B of FIG. 2.

Figure 1:
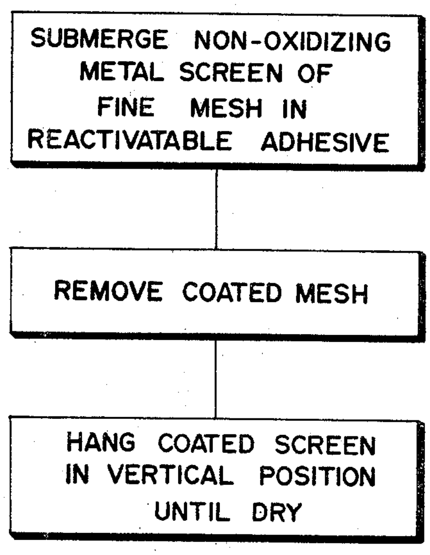
FIG. 1 is a flow chart depicting the process for manufacturing the conductive adhesive article.

As shown in FIG. 1, a non-oxidizing metallic screen of fine mesh is immersed in a suitable liquid adhesive until only the interstices thereof are at least partially filled with the adhesive. The adhesive used should be one of the well known types which may be reactivated either by the application of heat or an appropriate solvent. The liquid adhesive should have the consistency of thin syrup or a viscosity of approximately 2,000 to 4,000 centipoises. The base of representative commercial adhesives used by applicants has been synthetic rubber, but other bases could be used equally well, provided they have the necessary characteristics of being reactivatable and being of low viscosity.

In order to achieve the maximum conduction, the screen should be within the range of No. 125 to No. 200 mesh with an optimum size of No. 165. The wire caliper used in the screen should be within the range of .0015 inch to .0035 inch with the optimum caliper being .0015 inch.

The second step of the process involves removal of the coated screen from the adhesive bath, with the third step entailing the air-drying of the coated screen in a vertical position.

Figure 3:
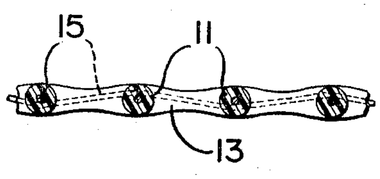
FIG. 3 is a cutaway section taken at line A—A of FIG. 2.

Upon completion of the drying step, the conductive adhesive article is not tacky and may be stored for some period of time without deterioration. As will be seen in FIGS. 2 and 3, the adhesive 11 at least partially fills the interstices 13 of the screen but leaves the wires 15 generally uncoated, because of the fairly low viscosity of the adhesive in liquid form. Due to the thinness of the wires 15 and the relatively slight amount of adhesive 11 attaching thereto, the article may be cut into various sizes and shapes either in a later manufacturing process or in a specific application as the immediate need arises.

Although the steps of the process have been described generally, it will be obvious to one skilled in the art that the latitude available in this invention permits either simple manual procedures for making the article or complex automatic system for larger scale operations.

Heat and pressure reactivation

Figure 4:
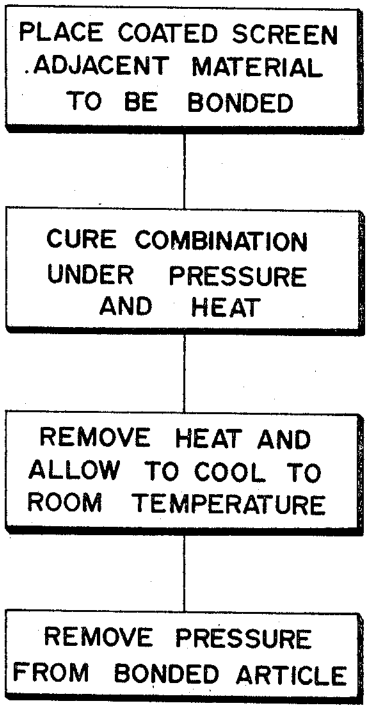
FIG. 4 is a flow chart depicting the heat and pressure method of bonding two conductors.

As shown in FIG. 4, the conductive adhesive article, after being cut to the desired shape, is placed adjacent to the material to be bonded. This may be either between two conductors or simply bonded to one surface of a single conductor. This combination is then cured in a heated press. The exact amount of pressure, heat and time required to properly cure the combination are dependent upon the characteristics of the commercial adhesive which is being used. In general, it can be said that for most purposes for which this article would have application, a pressure of 2,000 p.s.i. exerted with an accompanying temperature of 225° F. for a period of five minutes is sufficient.

At the end of the five-minute period, the heating means is turned off and the bonded article is allowed to cool to approximately room temperature while still under pressure. The cooling process may be accomplished either naturally or with artificial means. In either event, when the temperature of the bonded conductors has reached ambient, the pressure may be released and the bonded article removed from the press.

Solvent pressure reactivation

Figure 5:
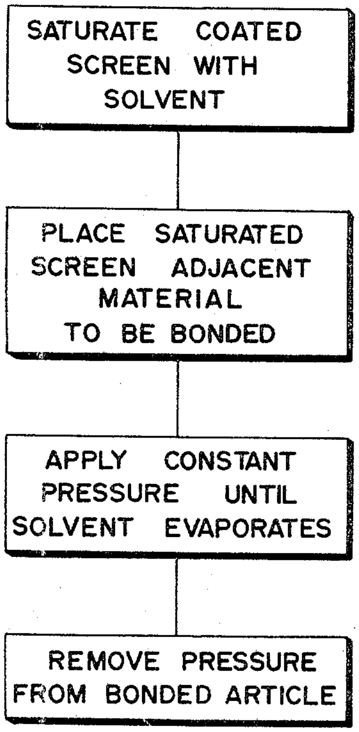
FIG. 5 is a flow chart depicting the solvent-pressure method of bonding two conductors.

As shown in FIG. 5, the conductive adhesive article is first saturated by a suitable solvent which softens the adhesive. The saturated conductive adhesive article is then placed adjacent the conductive surface or surfaces to which it is either to be bonded or it is to bond, respectively. A constant pressure of approximately 25 p.s.i. is then maintained on the combination until the solvent has completely evaporated. The time required for evaporation to take place will vary with the solvent and the adhesive being used. However, it may be stated generally that a minimum evapoartion time of two hours will be required to achieve satisfactory bonding, but in order to obtain maximum bonding, the pressure should be applied for approximately eighteen hours.

Upon completion of this curing process, the pressure may be removed and the bonded article taken from the press.

The type of solvent to be used is dependent upon the adhesive material which has been utilized in the manufacture of the conductive adhesive article and the most effective solvents may be ascertained from the manufacturers' products literature. For example, methylethyl ketone (MEK) or acetone is suitable in many applications.

In either of the two methods of reactivation hereinabove described, the adhesive does not coat the outer surfaces of the mesh but lies only in the interstices thereof. By so doing, the adhesive does not prevent good metal-to-metal contact between the conductors through the mesh as was the problem when attemping to use silicone conductive gaskets in combination with an adhesive. In addition, the use of common or inexpensive reactivatable adhesives has reduced the cost of the conductive adhesive article so that it is within an acceptable price range for most applications.

Figure 6:
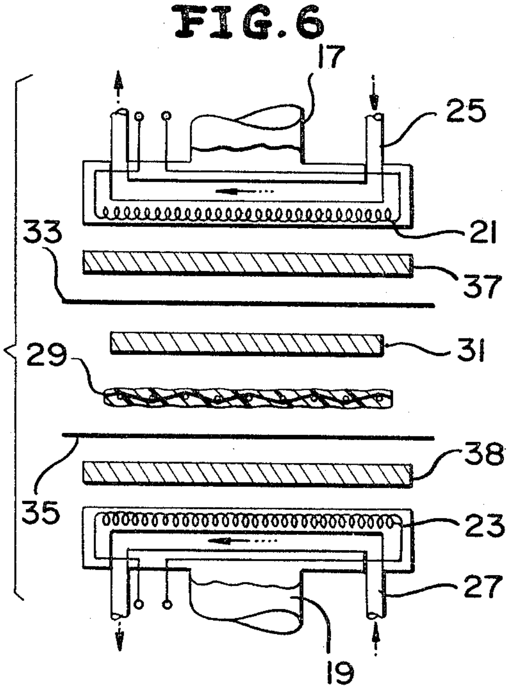
FIG. 6 is a schematic representation of a heated-cooled press suitable for utilization in bonding the conductive adhesive article to a conductive surface or bonding two conductors.

Representative apparatus for the manufacture of the conductive adhesive foil is shown in FIG. 6, wherein upper and lower press members 17 and 19, have heating coils 21 and 23 respectively and cooling elements 25 and 27, respectively located thereon. Suitable mechanical or hydraulic means may be employed to move the upper and lower press members 17 and 19, into a pressure-contact relationship.

In operation, the conductive adhesive article 29 is placed adjacent a thin metallic foil 31 with thin sheets of material 33 and 35 overlaying the upper and lower surfaces, respectively. The sheets 33 and 35 should have the characteristics of being resistive to solvents, substantially non-moisture absorptive, and resistive to adhesion. This combination of foil, adhesive article and thin sheets of material is placed between upper and lower metal platens 37 and 38, respectively, with this latter combination being placed on the lower press member 19 with the press members 17 and 19 being cooperatively moved so as to exert a pressure of approximately 2,000 p.s.i. thereon.

Heating coils 21 and 23 are energized until a temperature of 225° F. is reached, with this temperature being maintained for approximately five minutes. At the end of the five-minute period, the heating coils 21 and 23 are deenergized and cooling elements 25 and 27 are activated to lower the temperature of the bonded article to ambient.

Upon reaching room temperature, the pressure may be released and the conductive adhesive article with the foil bonded thereto removed from the press.

Figure 9:
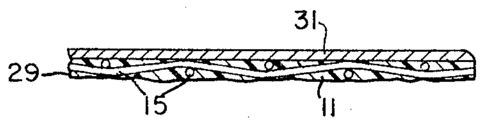
FIG. 9 is a fragmentary sectional view of the article formed in accordance with the process disclosed in FIG.

FIG. 9 shows the finished product resulting from the process of FIG. 6 wherein the metal foil 31 is bonded to the conductive adhesive mesh screen 29. As is shown in the figure, the wires 15 of the screen 29 are in electrical contact with the foil 31. The reactivatable adhesive 11 bonds the screen 29 to the foil but does not coat the outermost portions of the sides of the screen. Electrical conduction between the foil and the screen is secured, and conduction will be acquired between the resultant product and another conductive article when the product is bonded to the article, such as for printed circuit repairs.

Figure 7:
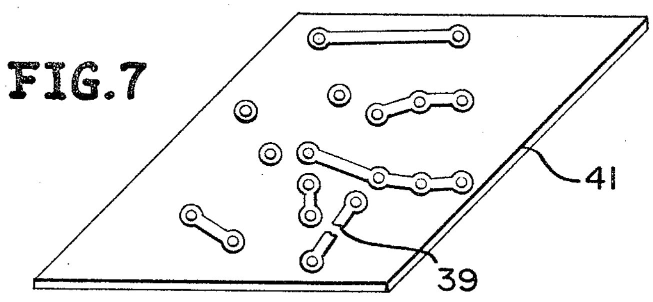
FIG. 7 is an isometric view of a printed circuit board showing a rupture thereon.
Figure 8:
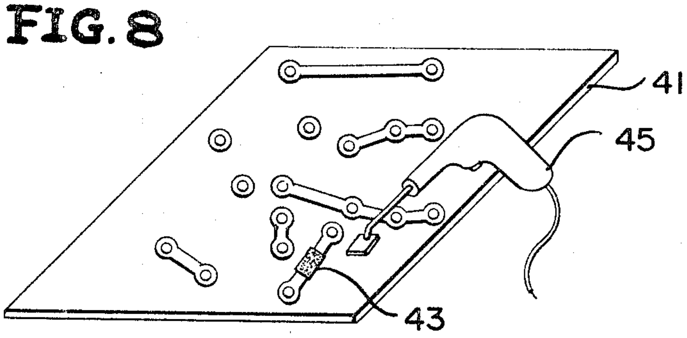
FIG. 8 is an isometric view of a circuit board within the invention showing a circuit repair using the applicants' invention.

This conductive adhesive foil may be used in the repair of printed circuit boards as shown in FIGS. 7 and 8, wherein a rupture 39 is shown in the circuit board 41. A small strip of conductive adhesive foil 43 is placed so as to bridge the rupture 39, and heating means 45, such as a soldering iron having a pressure face thereon, is applied to the foil 43 causing reactivation of the article and repair of the rupture.

Although specific apparatus has been shown for the purpose of describing the manufacture of the conductive metallic foil, it will be apparent to those skilled in the art that other variations in the specific structure illustrated and the component materials mentioned, may be made without departing from the spirit and scope of the invention which is limited only by the appended claims.

We claim:

1. A reactivatable conductive adhesive foil comprising
a non-oxidizing metallic screen of fine mesh,
a reactivatable adhesive at least partially filling the interstices of said screen, and
a sheet of metallic foil bonded to one side of said screen with portions of said foil and said screen being in metal-to-metal contact.

2. The process for making a reactivatable conductive adhesive foil comprising the steps of
coating a non-oxidizing metal screen of fine mesh by dipping said screen in a reactivatable adhesive bath, said adhesive at least partially filling the interstices of said screen,
drying said coated screen in a vertical position,
placing said coated screen adjacent a sheet of metal foil,
applying pressure to the combination of said foil and said screen to insure metal-to-metal contact therebetween,
reactivating said adhesive in said screen by heating said combination, and
cooling said combination while still subjected to said pressure.

3. The process for making a reactivatable conductive adhesive foil comprising the steps of
coating a nonoxidizing metal screen of fine mesh by dipping said screen in a reactivatable adhesive bath. said adhesive at least partially filling the interstices of said screen,
drying said coated screen in a vertical position,
reactivating said adhesive coated screen by saturating said screen with solvent,
placing said saturated screen adjacent a sheet of metal foil, and
applying pressure to the combination of said saturated screen and foil to insure metal-to-metal contact therebetween until said solvent evaporates.

4. An electrically conductive bondable article comprising
a flat metallic screen of fine mesh,
a non-tacky reactivatable adhesive substance at least partially filling the interstices of the metallic screen but leaving exposed the outermost portions of each side thereof, said adhesive substance having the capability of being reactivated to a tacky adherent condition, and
a thin metallic sheet overlying one side of the screen and bonded in metal-to-metal contact to the exposed portions of the screen.

5. The process of fabricating an electrically conductive reactivatable adhesive article comprising the steps of:
subjecting a metal screen of fine mesh to a liquid solution of an adhesive substance so as to at least partially fill the interstices of the screen but leaving exposed the outermost portions of each side of the screen,
drying the adhesively coated screen to render the adhesive substance relatively non-tacky,
overlying one side of the screen with a metallic sheet,
reactivating the adhesive substance, and
subjecting the combination of the sheet and screen to pressure while the adhesive substance is in its activated state whereby the sheet is brought into metal-to-metal contact with the exposed portions of the screen and bonded thereto by the adhesive substance.

6. A pliable conductive article comprising
a body of thin malleable sheet metal,
a conductive grid secured to the bottom surface of said body in conductive contact therewith, and
a layer of reactivatable, non-tacky adhesive material on said bottom surface with the bottom surface of said adhesive layer substantially flush with the bottom plane of said grid for securing the article to a metal surface with said grid in conductive engagement with the metal surface.

7. A pliable conductive article comprising
a web of malleable metal foil,
a malleable wire mesh grid conductively secured to the bottom surface of said web and extending substantially over the area defined by said bottom surface, and
reactivatable, non-tacky adhesive material on said bottom surface in the meshes of said grid and being substantially flush with the bottom plane of the grid for securing the article in covering relation to a metal surface with the grid in conductive contact with said metal surface.

8. A conductive sheet-like article comprising
a web of malleable metal foil,
a malleable wire mesh grid conductively secured to the bottom surface of said web and being distributed over the area of said bottom surface, and
reactivatable, non-tacky adhesive material in the meshes of said grid and being substantially flush with the bottom plane of the grid for securing the conductive article on the surface portion of a conductor with the grid in conductive contact therewith.

9. In combination,
a metal body exposed in a fluid medium,
a conductive metal foil member covering said body,
a wire mesh intermediate member secured conductively to the inner surface of said foil member and conductively engaging said body, and
reactivatable, non-tacky adhesive material carried in the meshes of said intermediate member and adhesively securing the foil member to the body, whereby said foil member is a conductive extension of said body in said medium.

10. In combination,
a metal body,
a web of malleable metal foil wrapped about exposed surface portions of said metal body,
a malleable electrically conductive grid interposed between the web and the body in conductive contact with said web and body, and
reactivatable, non-tacky means securing said foil to said body.

11. In combination,
a metal body,
a web of malleable metal foil wrapped about exposed surface portions of said body,
a malleable electrically conductive grid interposed between the web and the body in conductive contact with said web and body, and
reactivatable, non-tacky adhesive material in the meshes of said grid securing the web to the body.

12. In combination,
a metal body,
a web of malleable metal foil wrapped about exposed surface portions of the metal body,
a layer of malleable wire screen material interposed between the web and the body,
said layer being conductively secured to the web and being in conductive contact with the body, and
reactivatable, non-tacky adhesive material disposed in the meshes of said wire screen material and being in adhesive contact with the body, whereby to secure the web to the body with the web forming a conductive extension of the body.

(References on following page)

References Cited

UNITED STATES PATENTS

| | | | |
|---|---|---|---|
| 3,355,545 | 11/1967 | Kilduff et al. | 174—117 X |
| 2,477,267 | 7/1949 | Robinson | 174—35 |
| 3,140,342 | 7/1964 | Ehrreich et al. | 174—35 |

FOREIGN PATENTS

| | | |
|---|---|---|
| 215,968 | 7/1958 | Australia. |
| 565,540 | 7/1957 | Italy. |

LARAMIE E. ASKIN, *Primary Examiner.*

U.S. Cl. X.R.

156—228, 305; 161—114, 167; 174—68.5, 117, 133